(12) United States Patent
He et al.

(10) Patent No.: US 12,674,825 B2
(45) Date of Patent: Jul. 7, 2026

(54) WIRELESS CIRCUITRY WITH LOW-NOISE PEAK DETECTION

(71) Applicant: Apple Inc., Cupertino, CA (US)

(72) Inventors: Shan He, Austin, TX (US); Mark T Dawkins, San Jose, CA (US); Paul-Aymeric H Fontaine, Austin, TX (US)

(73) Assignee: Apple Inc., Cupertino, CA (US)

( * ) Notice: Subject to any disclaimer, the term of this patent is extended or adjusted under 35 U.S.C. 154(b) by 68 days.

(21) Appl. No.: 18/594,749

(22) Filed: Mar. 4, 2024

(65) Prior Publication Data

US 2025/0277825 A1      Sep. 4, 2025

(51) Int. Cl.
G01R 19/04          (2006.01)
G01R 19/00          (2006.01)
H03D 7/16           (2006.01)

(52) U.S. Cl.
CPC ......... G01R 19/04 (2013.01); G01R 19/0007 (2013.01); H03D 7/168 (2013.01)

(58) Field of Classification Search
CPC ..... H04B 17/318; H04B 17/409; H03F 3/345; H03F 3/193; H03F 2200/471; H03F 2200/451; H03F 2200/294; G01R 19/165
See application file for complete search history.

(56) References Cited

U.S. PATENT DOCUMENTS

| | | | | |
|---|---|---|---|---|
| 6,710,716 | B1 * | 3/2004 | Abe | H03D 1/18 330/277 |
| 7,274,206 | B2 | 9/2007 | Prikhodko et al. | |
| 8,648,588 | B2 | 2/2014 | Eken et al. | |
| 9,367,711 | B1 | 6/2016 | Dacus et al. | |
| 10,664,001 | B2 | 5/2020 | Abouzied et al. | |
| 2008/0238530 | A1 * | 10/2008 | Ito | G11C 16/30 327/513 |
| 2012/0202441 | A1 | 8/2012 | Mimino | |
| 2013/0241705 | A1 | 9/2013 | Rodriguez et al. | |
| 2013/0324062 | A1 | 12/2013 | Wang et al. | |
| 2017/0363665 | A1 | 12/2017 | Vora | |
| 2022/0352858 | A1 * | 11/2022 | Taschwer | H03F 3/45636 |
| 2023/0276380 | A1 | 8/2023 | Liu et al. | |

FOREIGN PATENT DOCUMENTS

| | | | |
|---|---|---|---|
| EP | 1331742 | | 7/2003 |
| KR | 20010030469 A | * | 4/2001 |

* cited by examiner

*Primary Examiner* — Quan Tra
(74) *Attorney, Agent, or Firm* — Treyz Law Group, P.C.; Michael H. Lyons

(57) ABSTRACT

An electronic device may include an antenna, a receiver, and a transmission line path that couples the antenna to the receiver. A peak detector may receive a radio-frequency signal from the transmission line path and may output a DC voltage indicative of a peak voltage level of the signal. The peak detector may include a pair of square law transistors having source-drain terminals coupled to an output of the peak detector. The peak detector may include a differential pair of transistors coupled between a power supply voltage and the output. The peak detector may include diode-connected transistors coupled between the source-drain terminals and gate terminals of the square law transistors. The diode-connected transistors may cause noise current to flow along feedback loop paths from the source-drain terminals onto the gate terminals of the square law transistors. This may remove noise from the output of the peak detector.

12 Claims, 6 Drawing Sheets

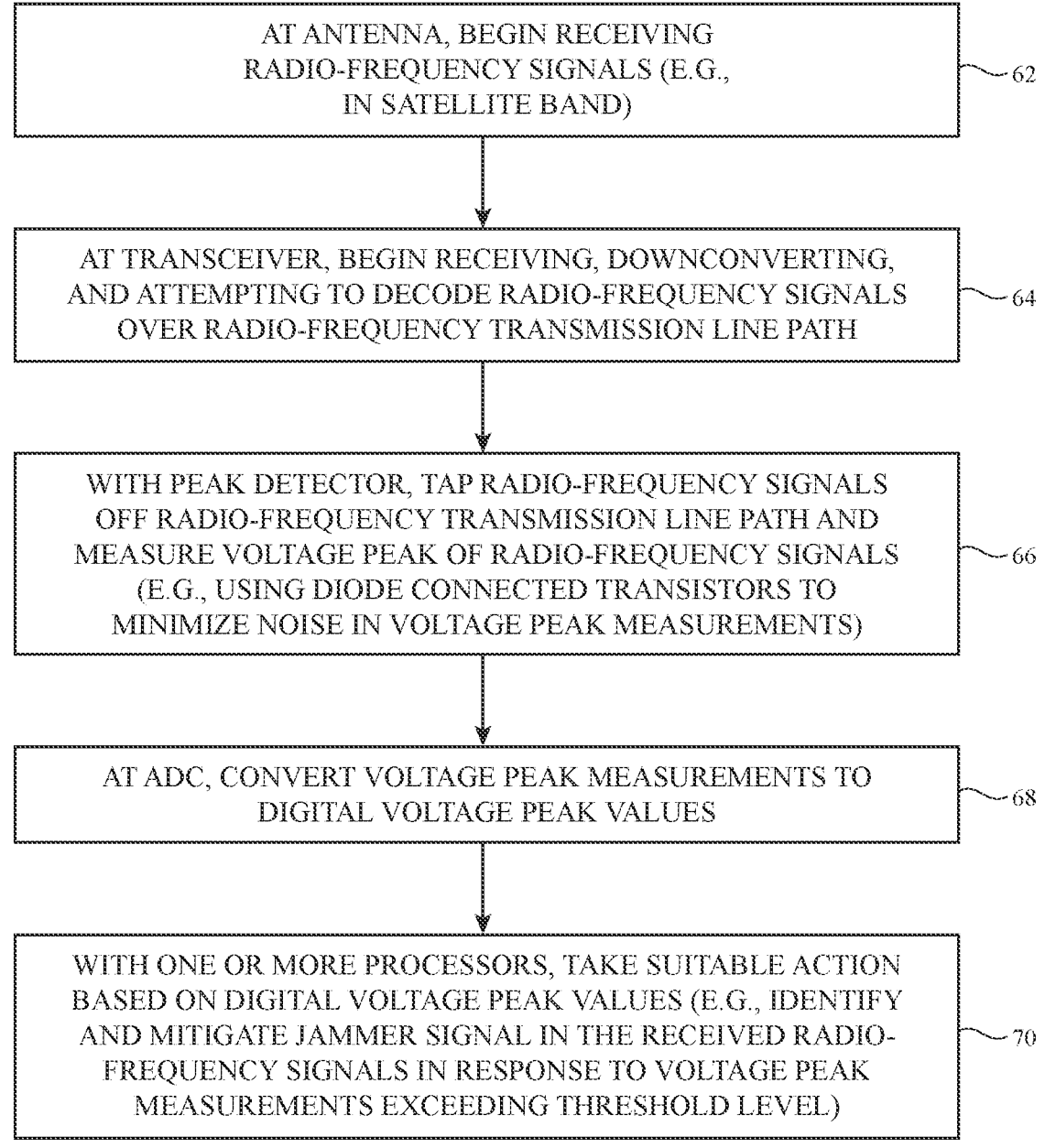

AT ANTENNA, BEGIN RECEIVING
RADIO-FREQUENCY SIGNALS (E.G.,
IN SATELLITE BAND)     ～62

AT TRANSCEIVER, BEGIN RECEIVING, DOWNCONVERTING,
AND ATTEMPTING TO DECODE RADIO-FREQUENCY SIGNALS
OVER RADIO-FREQUENCY TRANSMISSION LINE PATH     ～64

WITH PEAK DETECTOR, TAP RADIO-FREQUENCY SIGNALS
OFF RADIO-FREQUENCY TRANSMISSION LINE PATH AND
MEASURE VOLTAGE PEAK OF RADIO-FREQUENCY SIGNALS
(E.G., USING DIODE CONNECTED TRANSISTORS TO
MINIMIZE NOISE IN VOLTAGE PEAK MEASUREMENTS)     ～66

AT ADC, CONVERT VOLTAGE PEAK MEASUREMENTS TO
DIGITAL VOLTAGE PEAK VALUES     ～68

WITH ONE OR MORE PROCESSORS, TAKE SUITABLE ACTION
BASED ON DIGITAL VOLTAGE PEAK VALUES (E.G., IDENTIFY
AND MITIGATE JAMMER SIGNAL IN THE RECEIVED RADIO-
FREQUENCY SIGNALS IN RESPONSE TO VOLTAGE PEAK
MEASUREMENTS EXCEEDING THRESHOLD LEVEL)     ～70

*FIG. 4*

WIRELESS CIRCUITRY WITH LOW-NOISE PEAK DETECTION

FIELD

This disclosure relates generally to electronic devices, including electronic devices with wireless communications circuitry.

BACKGROUND

Electronic devices are often provided with wireless communications capabilities. An electronic device with wireless communications capabilities has wireless circuitry with antennas that are used to transmit and receive radio-frequency signals.

Some radio-frequency signals are received by the electronic device at relatively low signal levels. If care is not taken, radio-frequency signals at relatively low signal levels can exhibit excessive noise, which can interfere with the satisfactory reception and measurement of the radio-frequency signals.

SUMMARY

An electronic device may include wireless circuitry. The wireless circuitry may include an antenna, a receiver, and a radio-frequency transmission line path that couples the antenna to the receiver. The wireless circuitry may include a peak detector coupled to the radio-frequency transmission line path. The peak detector may receive a radio-frequency signal from the radio-frequency transmission line path. The peak detector may output a DC voltage indicative of a peak voltage level of the radio-frequency signals (e.g., a DC voltage proportional to a square of the peak voltage level).

The peak detector may include a pair of square law transistors coupled in parallel between a power supply voltage and ground. The pair of square law transistors may have source-drain terminals coupled to an output of the peak detector. The peak detector may include a differential pair of transistors coupled between the power supply voltage and the output. The peak detector may include diode-connected transistors coupled between the source-drain terminals and gate terminals of the pair of square law transistors. The diode-connected transistors may cause noise current to flow in a single direction along feedback loop paths from the source-drain terminals onto the gate terminals of the pair of square law transistors. This may serve to cancel out noise from the DC voltage output by the peak detector.

An aspect of the disclosure provides a voltage peak detector having an input terminal and a differential output. The voltage peak detector can include a first transistor having a first gate terminal communicatively coupled to the input terminal, having a first source-drain terminal coupled to a first output terminal of the differential output, and having a second source-drain terminal communicatively coupled to a ground. The voltage peak detector can include a second transistor having a third source-drain terminal coupled to a power supply voltage and having a fourth source-drain terminal coupled to the first output terminal. The voltage peak detector can include a diode-connected transistor having a fifth source-drain terminal coupled to the first output terminal and having a sixth source-drain terminal coupled to the first gate terminal.

An aspect of the disclosure provides wireless circuitry. The wireless circuitry can include a radio-frequency transmission line path configured to convey a radio-frequency signal. The wireless circuitry can include an analog-to-digital converter (ADC). The wireless circuitry can include a peak detector having an output communicatively coupled to the ADC. The peak detector can include a differential pair of transistors coupled between a power supply voltage and the output. The peak detector can include a first transistor having a first gate terminal configured to receive the radio-frequency signal from the radio-frequency transmission line path and having a first source-drain terminal coupled to the output. The peak detector can include a second transistor having a second source-drain terminal coupled to the output and the first source-drain terminal, having a second gate terminal coupled to the second source-drain terminal, and having a third source-drain terminal coupled to the first gate terminal.

An aspect of the disclosure provides an electronic device. The electronic device can include an antenna. The electronic device can include a receiver communicatively coupled to the antenna and configured to receive a radio-frequency signal using the antenna. The electronic device can include circuitry configured to identify a peak voltage level of the radio-frequency signal. The circuitry can include a pair of square law transistors coupled in parallel between a power supply voltage and a ground. The circuitry can include a differential pair of transistors coupled between the pair of square law transistors and the power supply voltage. The circuitry can include noise-cancelling devices coupled between source-drain terminals and gate terminals of the pair of square law transistors, the noise-cancelling devices being configured to pass current in a single direction from the source-drain terminals of the pair of square law transistors onto the gate terminals of the pair of square law transistors.

BRIEF DESCRIPTION OF THE DRAWINGS

FIG. 4 is a flow chart of illustrative operations involved in performing wireless communications using wireless circuitry having a peak detector coupled to a radio-frequency transmission line path in accordance with some embodiments.

DETAILED DESCRIPTION

Figure 1:
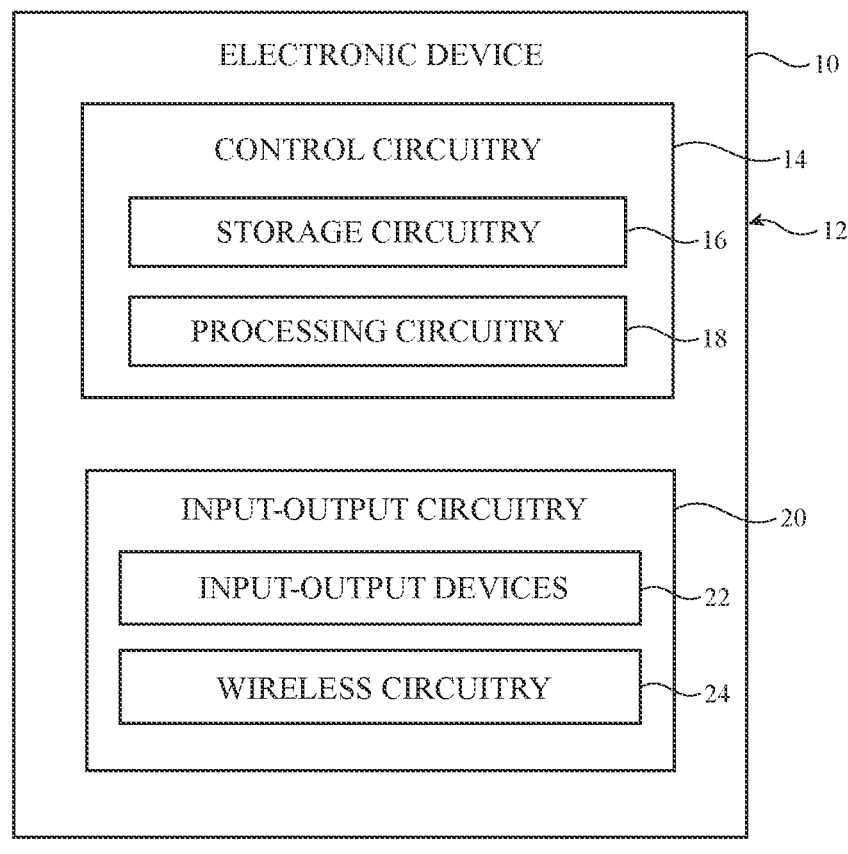
FIG. 1 is a diagram of an illustrative electronic device having wireless circuitry in accordance with some embodiments.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses, goggles, a helmet, or other equipment worn on a user's head (e.g., a head-mounted display device), or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed from plastic, glass, ceramics, fiber composites, metal (e.g., stainless steel, aluminum, metal alloys, etc.), other suitable materials, or a combination of these materials. In some embodiments, parts or all of housing 12 may be formed from dielectric or other low-conductivity material (e.g., glass, ceramic, plastic, sapphire, etc.). In other embodiments, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more processors such as microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultrawideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas. Wireless circuitry 24 may also include baseband processor circuitry, transceiver circuitry, amplifier circuitry, filter circuitry, switching circuitry, radio-frequency transmission lines, and/or any other circuitry for transmitting and/or receiving radio-frequency signals using the antenna(s).

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHz), satellite navigation frequency bands (e.g., a Global Positioning System (GPS) L1 band (e.g., at 1575 MHz), L2 band (e.g., at 1228 MHz), L3 band (e.g., at 1381 MHz), L4 band (e.g., at 1380 MHz), and/or L5 band (e.g., at 1176 MHz), a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, satellite communications bands such as an L-band, S-band (e.g., from 2-4 GHz), C-band (e.g., from 4-8 GHz), X-band, Ku-band (e.g., from 12-18 GHz), Ka-band (e.g., from 26-40 GHz), etc. (e.g., for supporting bidirectional wireless communications via satellites orbiting Earth), industrial, scientific, and medical (ISM) bands such as an ISM band between around 900 MHz and 950 MHz or other ISM bands below or above 1 GHz, one or more unlicensed bands, one or more bands reserved for emergency and/or public services, and/or any other desired frequency bands of interest.

Figure 2:
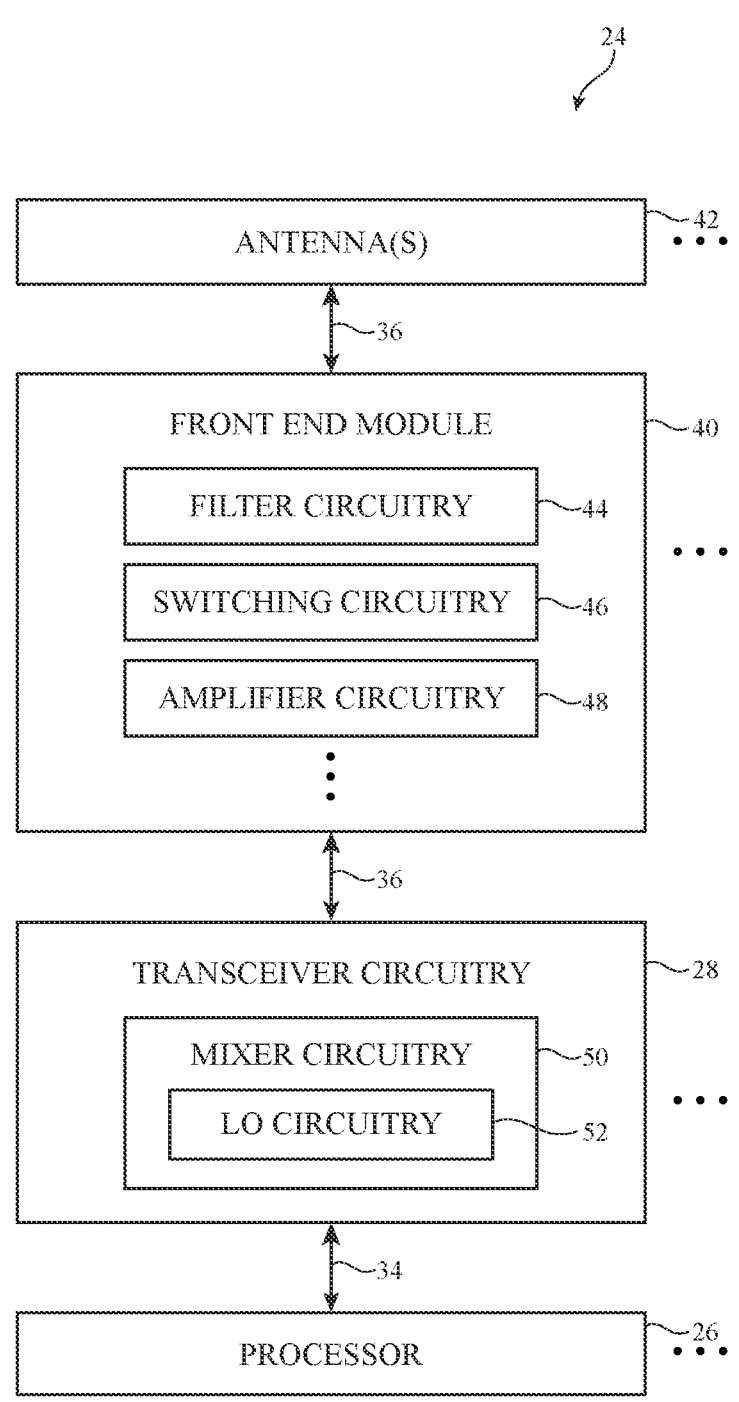
FIG. 2 is a diagram of illustrative wireless circuitry having a radio-frequency transmission line path in accordance with some embodiments.

FIG. 2 is a diagram showing illustrative components within wireless circuitry 24. As shown in FIG. 2, wireless circuitry 24 may include one or more processors such as processor(s) 26, radio-frequency (RF) transceiver circuitry such as radio-frequency transceiver 28, radio-frequency front end circuitry such as radio-frequency front end module (FEM) 40, and antenna(s) 42. Processor 26 may be a baseband processor, an application processor, a digital signal processor, a microcontroller, a microprocessor, a central processing unit (CPU), a programmable device, a combination of these circuits, and/or one or more processors within processing circuitry 18 (FIG. 1). Processor 26 may be configured to generate digital (transmit or baseband) signals. Processor 26 may be coupled to transceiver 28 over path 34 (sometimes referred to as a baseband path). Transceiver 28 may be coupled to antenna 42 via radio-frequency transmission line path 36. Radio-frequency front end module 40 may be interposed on radio-frequency transmission line path 36 between transceiver 28 and antenna 42.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

In the example of FIG. 2, wireless circuitry 24 is illustrated as including only a single processor 26, a single transceiver 28, a single front end module 40, and a single antenna 42 for the sake of clarity. In general, wireless circuitry 24 may include any desired number of processors 26, any desired number of transceivers 28, any desired number of front end modules 40, and any desired number of antennas 42. Each processor 26 may be coupled to one or more transceiver 28 over respective paths 34. Each transceiver 28 may include a transmitter circuit configured to output uplink signals to antenna 42, may include a receiver circuit configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module interposed thereon.

Front end module (FEM) 40 may include radio-frequency front end circuitry that operates on the radio-frequency signals conveyed (transmitted and/or received) over radio-frequency transmission line path 36. Front end module may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifiers and one or more low-noise amplifiers), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip.

Filter circuitry 44, switching circuitry 46, amplifier circuitry 48, and other circuitry may be disposed on radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc.

Transmission lines in device 10 such as transmission lines in radio-frequency transmission line path 36 may be integrated into rigid and/or flexible printed circuit boards. In one suitable arrangement, radio-frequency transmission line paths such as radio-frequency transmission line path 36 may also include transmission line conductors integrated within multilayer laminated structures (e.g., layers of a conductive material such as copper and a dielectric material such as a resin that are laminated together without intervening adhesive). The multilayer laminated structures may, if desired, be folded or bent in multiple dimensions (e.g., two or three dimensions) and may maintain a bent or folded shape after bending (e.g., the multilayer laminated structures may be folded into a particular three-dimensional shape to route around other device components and may be rigid enough to hold its shape after folding without being held in place by stiffeners or other structures). All of the multiple layers of the laminated structures may be batch laminated together (e.g., in a single pressing process) without adhesive (e.g., as opposed to performing multiple pressing processes to laminate multiple layers together with adhesive).

Transceiver 28 may include wireless local area network transceiver circuitry that handles WLAN communications bands, wireless personal area network transceiver circuitry that handles the 2.4 GHz Bluetooth® band or other WPAN communications bands, cellular telephone transceiver circuitry that handles cellular telephone bands, near-field communications (NFC) transceiver circuitry that handles near-field communications bands, satellite navigation receiver circuitry that handles satellite navigation bands, ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

In performing wireless transmission, processor 26 may provide digital signals to transceiver 28 over path 34. Transceiver 28 may further include circuitry for converting the baseband signals received from processor 26 into corresponding intermediate frequency or radio-frequency signals. For example, transceiver 28 may include mixer circuitry 50 for up-converting (or modulating) the baseband signals to intermediate frequencies or radio frequencies prior to transmission over antenna 42. Transceiver 28 may also include digital-to-analog converter (DAC) and/or analog-to-digital converter (ADC) circuitry for converting signals between digital and analog domains. Transceiver 28 may include a transmitter component to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from external wireless equipment. The received radio-frequency signals may be conveyed to transceiver 28 via radio-frequency transmission line path 36 and front end module 40. Transceiver 28 may include circuitry for converting the received radio-frequency signals into corresponding intermediate frequency or baseband signals. For example, transceiver 28 may use mixer circuitry 50 for downconverting (or demodulating) the received radio-frequency signals to baseband frequencies prior to conveying the received signals to processor 26 over path 34. Mixer circuitry 50 can include local oscillator circuitry such as local oscillator (LO) circuitry 52. Local oscillator circuitry 52 can generate oscillator signals that mixer circuitry 50 uses to modulate transmitting signals from baseband frequencies to radio frequencies and/or to demodulate the received signals from radio frequencies to baseband frequencies.

The term "convey radio-frequency signals" as used herein means the transmission and/or reception of the radio-frequency signals (e.g., for performing unidirectional and/or bidirectional wireless communications with external devices). Similarly, the term "convey wireless data" as used herein means the transmission and/or reception of wireless data using radio-frequency signals (e.g., where the wireless data is modulated onto one or more carriers of the radio-frequency signals). Antenna(s) 42 may transmit the radio-frequency signals by radiating the radio-frequency signals into free space (or to free space through intervening device structures such as a dielectric cover layer). Antenna(s) 42 may additionally or alternatively receive the radio-frequency signals from free space (or from free space through intervening devices structures such as a dielectric cover layer). The transmission and reception of radio-frequency signals by antenna(s) 42 each involve the excitation or resonance of antenna currents on an antenna resonating element in the antenna(s) by the radio-frequency signals within the frequency band(s) of operation of the antenna(s).

Figure 3:
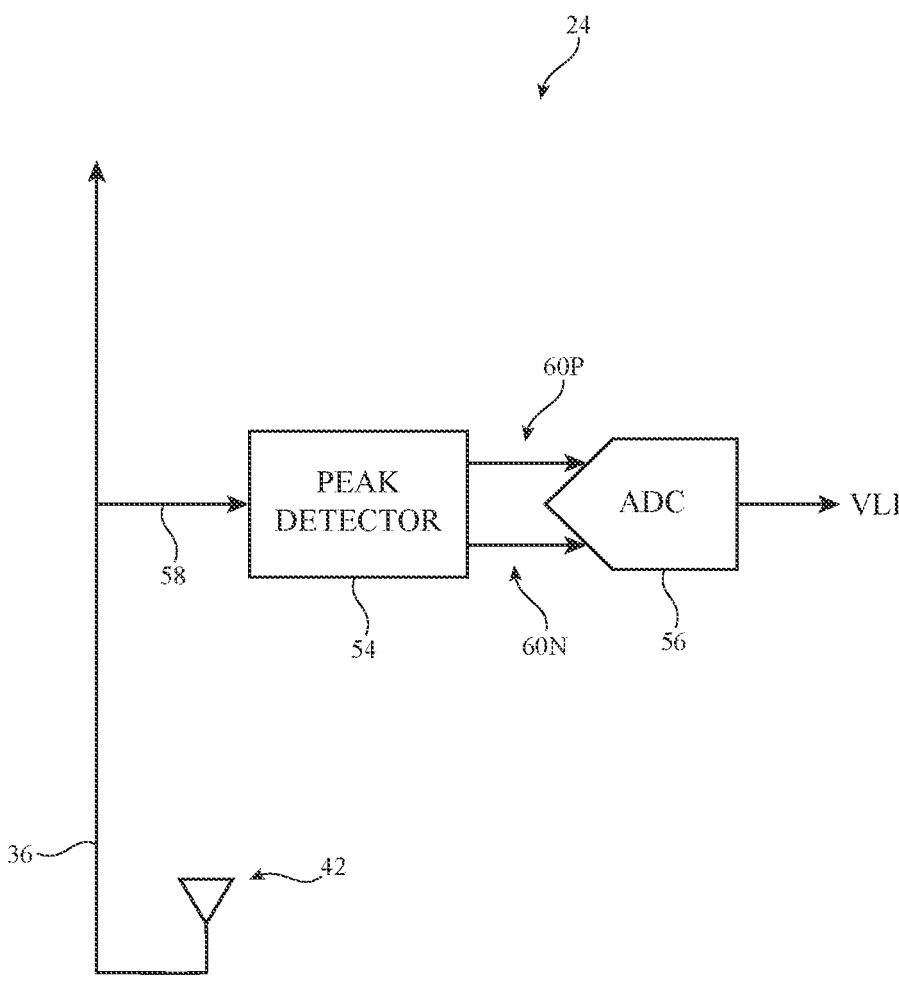
FIG. 3 is a diagram of illustrative wireless circuitry having a peak detector coupled to a radio-frequency transmission line path in accordance with some embodiments.

In practice, it may be desirable to be able to measure the level of signal peaks in the radio-frequency signals conveyed over radio-frequency transmission line path 36 (e.g., between antenna(s) 42 and transceiver 28). Wireless circuitry 24 may include a peak detector that measures the level of signal peaks in the radio-frequency signals conveyed over radio-frequency transmission line path 36. FIG. 3 is a diagram showing one example of how wireless circuitry 24 may include a peak detector.

As shown in FIG. 3, wireless circuitry 24 may include a signal peak detector such as peak detector 54 and a peak detector ADC such as ADC 56. Peak detector 54 may have an input terminal coupled to radio-frequency transmission line path 36 over signal path 58. Signal path 58 may be a single-ended signal path and the input of peak detector 54 may be a single-ended input that receives single-ended signals from radio-frequency transmission line path 36 over signal path 58. Signal path 58 may be coupled to radio-frequency transmission line path 36 by a radio-frequency coupler, a signal splitter, a radio-frequency transformer, and/or other circuitry, as examples.

Peak detector 54 may have a differential output with a differential pair of output terminals coupled to a differential input of ADC 56 over differential signal path 60. Differential signal path 60 may include a differential pair of coupled lines such as a first (positive) signal line 60P and a second (negative) signal line 60N. The differential pair of output terminals of peak detector 54 may include a first output terminal coupled to signal line 60P and a second output terminal coupled to signal line 60N. ADC 56 may have a digital output coupled to processor 26 (FIG. 3), processing circuitry 18 (FIG. 1), and/or other circuitry in device 10.

Radio-frequency transmission line path 36 may convey radio-frequency signals between mixer circuitry 50 (FIG. 2) and antenna(s) 42. Signal path 58 and the input of peak detector 54 may be coupled to radio-frequency transmission line path 36 (e.g., at any desired location between antenna(s) 42 and mixer circuitry 50). Signal path 58, peak detector 54, and ADC 56 may, as examples, be integrated into transceiver circuitry 50 or front end module 40 or may be separate from transceiver circuitry 50 and front end module 40 of FIG. 2. While radio-frequency transmission line path 36 conveys radio-frequency signals, signal path 58 may tap or couple some of the radio-frequency signals (e.g., some of the power of the radio-frequency signals) off of radio-frequency transmission line path 36 and onto the input of peak detector 54. Signal path 58 conveys the radio-frequency signals to the input of peak detector 54 as single-ended signals.

Peak detector 54 may perform measurements of the peak level (e.g., amplitude) of the radio-frequency signals received over signal path 58. This may include measuring peak current level (e.g., peak current magnitude or current amplitude) and/or peak voltage level (e.g., peak voltage magnitude or voltage amplitude), as examples. Implementations in which peak detector 54 measures peak voltage levels (e.g., voltage amplitude) of the radio-frequency signals on radio-frequency transmission line path 36 are described herein as an example. Peak detector 54 is therefore sometimes also referred to herein as voltage peak detector 54, peak voltage magnitude detector 54, or voltage amplitude detector 54.

Peak detector 54 may output a differential signal onto signal lines 60P and 60N that identifies the peak level of the radio-frequency signals on radio-frequency transmission line path 36. Peak detector 54 may, for example, output a DC voltage across signal lines 60P and 60N having a magnitude that is based on the peak voltage level of the radio-frequency signals. ADC 56 may receive the DC voltage output by peak detector 54 over signal lines 60N and 60P. ADC 56 may convert the DC voltage into a digital signal and may output the digital signal as voltage level information (VLI). Voltage level information VLI may, for example, be a digital code that identifies the magnitude of the DC voltage output by peak detector 54 and/or the peak voltage level of the radio-frequency signals on radio-frequency transmission line path 36 (as detected, estimated, measured, and/or output by peak detector 54). Processing circuitry in device 10 may perform any desired operations based on voltage level information VLI (e.g., may adjust one or more tuning components of antenna(s) 42, may adjust impedance matching circuitry, may switch an antenna into or out of use, may adjust a transmit power level of an antenna, may activate or deactivate a transceiver or antenna, may power one or more components of device 10 on or off, may adjust a power consumption mode of device 10, may perform thermal mitigation operations, may identify and/or mitigate one or more jammer signals causing interference and/or noise on radio-frequency transmission line path 36, may provide voltage level information VLI as an input to one or more software applications, etc.).

Some types of radio-frequency signals are received by the antenna(s) 42 in device 10 at relatively low signal levels. Such radio-frequency signals may include, for example, radio-frequency signals transmitted by one or more satellites in a satellite navigation band and/or a satellite communications band. These radio-frequency signals are received by device 10 at low signal levels because the corresponding transmitter is located relatively far from device 10 (e.g., on one or more satellites in space), subjecting the radio-frequency signals to substantial propagation/path loss in reaching device 10. A transmitter may also have a limited output power level with which to transmit the radio-frequency signals. In some implementations, the transmitter may be a sensor node of a wireless sensor network. A sensor node in the wireless sensor network may be deployed in remote and/or harsh environments where communications links are subject to significant attenuation. In some implementations, the transmitter transmits the radio-frequency signals at relatively high frequencies that are subject to significant signal attenuation (e.g., millimeter wave frequencies, centimeter wave frequencies, sub-THz frequencies, etc.)

In these types of situations, it can be difficult for wireless circuitry 24 to differentiate a signal-of-interest in the radio-frequency signals (e.g., signal components that carry wireless data as transmitted by the corresponding transmitter) from noise. The noise may include thermal noise, electromagnetic noise, and/or other types of noise. At least some of the noise may, for example, be produced by one or more jammer signals present at device 10. Such jammer signals may be produced by electronic components in device 10, other antennas 42 in device 10, transceiver circuitry in device 10, nearby devices, thermal noise, and/or other sources of electromagnetic interference. If care is not taken, a low signal level of the signal-of-interest in the radio-frequency signals can cause noise to dominate the signal peak measurements performed by peak detector 54. This can make it difficult for peak detector 54 to perform accurate signal peak measurements. If desired, peak detector 54 may include one or more noise-cancelling transistors that help to mitigate noise in the radio-frequency signals, allowing peak detector 54 to perform accurate peak level measurements even when the signal-of-interest in the radio-frequency signals is at a low signal level.

FIG. 4 is a flow chart of operations involved in performing peak level measurements using peak detector 54. At operation 62, antenna 42 may begin to receive radio-frequency signals. The radio-frequency signals may be conveyed, as one example, in a satellite band (e.g., a satellite navigation band or a satellite communications band). The radio-frequency signals may therefore contain a signal-of-interest at a relatively low signal level. Radio-frequency transmission line path 36 may pass the radio-frequency signals received by antenna 42 to a receiver in transceiver 28 (FIG. 2).

At operation 64, transceiver 28 may begin to receive the radio-frequency signals over radio-frequency transmission line path 36. Transceiver 28 may begin to downconvert the radio-frequency signals to baseband signals (e.g., directly or via a first downconversion to an intermediate frequency and then a second downconversion to baseband). Transceiver 28 may begin to attempt to decode/demodulate wireless data from the baseband signals. Wireless circuitry 24 may continue to perform operations 62 and 64 concurrent with the remaining operations of FIG. 4.

At operation 66, signal path 58 may pass a portion of the radio-frequency signals on radio-frequency transmission line path 36 to peak detector 54. Peak detector 54 may measure the peak voltage level of the radio-frequency signals (e.g., may gather, generate, output, produce, estimate, and/or compute a peak voltage level value (measurement) that corresponds to or identifies the peak voltage level of the radio-frequency signals on radio-frequency transmission line path 36). Peak detector 54 may, for example, generate a DC voltage across signal lines 60P and 60N having a magnitude that is proportional to or otherwise identifies the peak voltage level of the radio-frequency signals on radio-frequency transmission line path 36 (e.g., the magnitude may be proportional to a square of the peak voltage level). Peak detector 54 may include one or more noise-cancelling transistors that cancel out noise from the radio-frequency signals, helping to ensure the accuracy of the peak voltage level value output by peak detector 54.

At operation 68, ADC 56 may convert the voltage peak level measurement generated by peak detector 54 into a corresponding digital value (e.g., voltage level information VLI of FIG. 3). ADC 56 may, for example, convert the DC voltage across signal lines 60P and 60N into a corresponding digital code that identifies the magnitude of the DC voltage. ADC 56 may pass the digital value to other circuitry for further processing.

At operation 70, one or more processors in device 10 (e.g., processor 26 of FIG. 2 and/or processing circuitry 18 of FIG. 1) may compute, calculate, estimate, or otherwise identify the peak voltage level of the radio-frequency signals based on the digital value (e.g., as proportional to a square of the DC voltage level identified by the digital value). The one or more processors in device 10 may perform any desired operations based on the peak voltage level of the radio-frequency signals (e.g., based on the digital value output by ADC 56 and thus the measurement performed by peak detector 54). As one example, the one or more processors may identify a jammer signal in the radio-frequency signals and may take suitable action to mitigate the jammer signal based on the digital value output by ADC 56. The one or more processors may, for example, identify that a jammer signal is present when/if the peak voltage level of the radio-frequency signals on radio-frequency transmission path exceeds a threshold peak voltage level. The one or more processors may attempt to mitigate the jammer signal by adjusting one or more tuning components of antenna(s) 42, adjusting impedance matching circuitry, switching an antenna 42 into or out of use, adjusting a transmit power level of one or more of antennas 42, activating or deactivating a transceiver or antenna in device 10, powering one or more components of device 10 on or off, adjusting a power consumption mode of device 10, performing thermal mitigation operations, and/or using any other methods. Once the jammer signal has been identified and mitigated, transceiver 28 may be able to more clearly identify the signal-of-interest in the received radio-frequency signals and to successfully decode wireless data from the signal-of-interest. As other examples, the one or more processors may detect the signal strength of the radio-frequency signals based on the digital value, may perform impedance measurements (e.g., S-parameter measurements) based on the digital value, may adjust one or more amplifiers, impedance matching circuitry, and/or antenna tuning circuitry on the radio-frequency transmission line path based on the digital value, may switch different antennas into or out of use based on the digital value, etc. These examples are illustrative and, in general, device 10 may perform any desired operations based on the measured peak voltage level.

Figure 5:
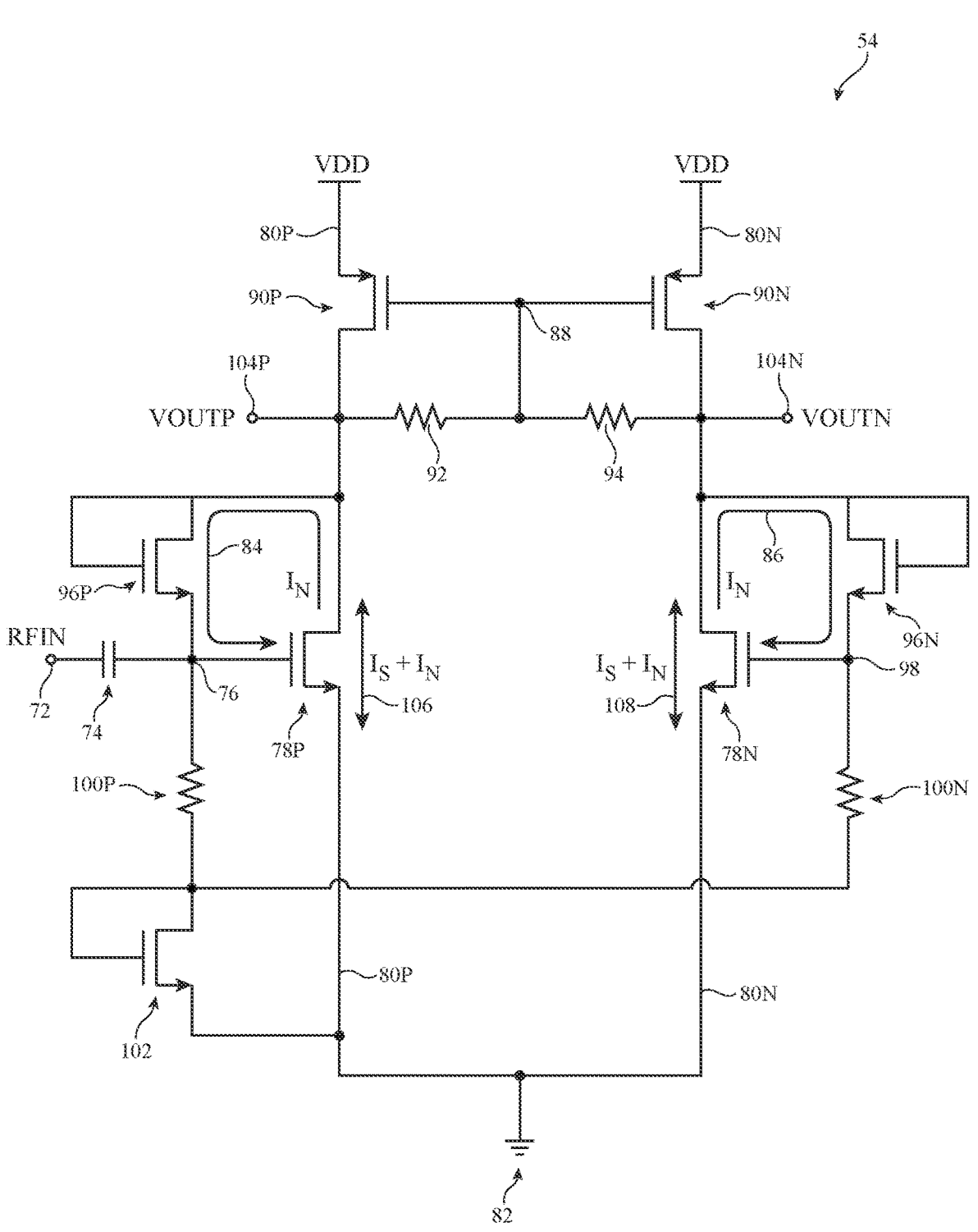
FIG. 5 is a circuit diagram of an illustrative peak detector having noise-canceling transistors in accordance with some embodiments.

FIG. 5 is a circuit diagram of peak detector 54. As shown in FIG. 5, peak detector 54 may include a differential signal path 80 that includes a first (positive) signal line 80P and a second (negative) signal line 80N coupled in parallel between power supply voltage VDD and a reference voltage such as ground 82. Peak detector 54 may have an input terminal 72 (e.g., a single-ended input terminal) coupled to signal path 58 (FIG. 3). Input terminal 72 may also be coupled to circuit node 76 in peak detector 54. If desired, peak detector 54 may include a capacitor 74 (e.g., a coupling capacitor) coupled in series between input terminal 72 and circuit node 54.

Peak detector 54 may have a differential output 104 that includes a first (positive) output terminal 104P coupled to signal line 80P and that includes a second (negative) output terminal 104N coupled to signal line 80N. Output terminal 104P is coupled to signal line 60P and output terminal 104N may be coupled to signal line 60N of FIG. 3.

Peak detector 54 may include a differential pair of transistors 90, including a first transistor 90P disposed on signal line 80P and a second transistor 90N disposed on signal line 80N. The differential pair of transistors 90 may perform single-ended-to-differential signal conversion for peak detector 54. Transistor 90P has a first source-drain terminal communicatively coupled to power supply voltage VDD through a first segment of signal line 80P and has a second source-drain terminal communicatively coupled to ground 82 through a second segment of signal line 80P. The second source-drain terminal of transistor 90P is also coupled to output terminal 104P. The gate terminal of transistor 90P is coupled to circuit node 88.

Similarly, transistor 90N has a first source-drain terminal communicatively coupled to power supply voltage VDD through a first segment of signal line 80N and has a second source-drain terminal communicatively coupled to ground 82 through a second segment of signal line 80N. The second source-drain terminal of transistor 90N is also coupled to output terminal 104N. The gate terminal of transistor 90N is coupled to circuit node 88. Peak detector 54 may include a resistor 92 coupled in series between circuit node 88 and output terminal 104P. Peak detector 54 may also include a resistor 94 coupled in series between circuit node 88 and output terminal 104N.

Peak detector 54 may include a pair of square law transistors such as transistors 78, including a first transistor 78P disposed on signal line 80P and a second transistor 78N disposed on signal line 80N. Transistor 78P has a first source-drain terminal coupled to output terminal 104P and the second source-drain terminal of transistor 90P (e.g., the first source-drain terminal of transistor 78P may be communicatively coupled to power supply voltage VDD through transistor 90P). Transistor 78P has a second source-drain terminal coupled to ground 82 (e.g., through the second segment of signal line 80P). The gate terminal of transistor 78P may be coupled to circuit node 76 and may be communicatively coupled to input terminal 72 through circuit node 76 and capacitor 74.

Transistor 78N has a first source-drain terminal coupled to output terminal 104N and the second source-drain terminal of transistor 90N (e.g., the first source-drain terminal of transistor 78N may be communicatively coupled to power supply voltage VDD through transistor 90N). Transistor 78N has a second source-drain terminal coupled to ground 82 (e.g., through the second segment of signal line 80N). The gate terminal of transistor 78N may be coupled to circuit node 98. Transistors 78N and 78P are square law devices and may perform a squaring function on signals passing through the transistors along signal lines 80P and 80N.

Peak detector 54 may include a bias transistor 102 and a pair of bias resistors 100, including bias resistor 100P and bias resistor 100N. Bias transistor 102 may have a first source-drain terminal coupled to its gate terminal. Bias transistor 102 may have a second source-drain terminal coupled to ground 82. Bias resistor 100P may be coupled in series between the first source-drain terminal of bias transistor 102 (or equivalently the gate terminal of bias transistor 102) and circuit node 76 (or equivalently the gate terminal of transistor 78P). Bias resistor 100N may be coupled in series between the first source-drain terminal of bias transistor 102 (or equivalently the gate terminal of bias transistor 102) and circuit node 98 (or equivalently the gate terminal of transistor 78N). Bias transistor 102 may bias the gate terminals of transistors 78P and 78N during peak detection.

To help mitigate noise in the radio-frequency signals measured by peak detector 54, peak detector 54 may include a pair of noise-cancelling transistors 96, including a first noise-cancelling transistor 96P and a second noise-cancelling transistor 96N. Noise-cancelling transistor 96P is a diode-connected transistor (e.g., having a source-drain terminal connected to its gate terminal) and is coupled between output terminal 104P and circuit node 76. Noise-cancelling transistor 96P is therefore sometimes also referred to herein as diode-connected transistor 96P. Noise-cancelling transistor 96P has a first source-drain terminal coupled to output terminal 104P (or equivalently the first source-drain terminal of transistor 78P and the second source-drain terminal of transistor 90P). The first source-drain terminal of noise-cancelling transistor 96P, output terminal 104P, the second source-drain terminal of transistor 90P, and the first source-drain terminal of transistor 78P are coupled to the gate terminal of noise-cancelling transistor 96P. Noise-cancelling transistor 96P has a second source-drain terminal coupled to circuit node 76 (or equivalently the gate terminal of transistor 78P). The current through diode-connected noise-cancelling transistor 96P may flow in a single direction from the first source-drain terminal of noise-cancelling transistor 96P to the second source-drain terminal of noise-cancelling transistor 96P. Current may not flow in the opposite direction, from the second source-drain terminal to the first source-drain terminal of noise-cancelling transistor 96P.

Noise-cancelling transistor 96N is also a diode-connected transistor and is coupled between output terminal 104N and circuit node 98. Noise-cancelling transistor 96N is therefore sometimes also referred to herein as diode-connected transistor 96N. Noise-cancelling transistor 96N has a first source-drain terminal coupled to output terminal 104N (or equivalently the first source-drain terminal of transistor 78N and the second source-drain terminal of transistor 90N). The first source-drain terminal of noise-cancelling transistor 96N, output terminal 104N, the second source-drain terminal of transistor 90N, and the first source-drain terminal of transistor 78N are coupled to the gate terminal of noise-cancelling transistor 96N. Noise-cancelling transistor 96N has a second source-drain terminal coupled to circuit node 98 (or equivalently the gate terminal of transistor 78N). The current through the diode-connected noise-cancelling transistor 96P may flow in a single direction from the first source-drain terminal of noise-cancelling transistor 96N to the second source-drain terminal of noise-cancelling transistor 96N. Current does not flow in the opposite direction, from the second source-drain terminal to the first source-drain terminal of noise-cancelling transistor 96N.

Implementations in which peak detector 54 includes noise-cancelling transistors 96P and 96N are described herein as an example. In general, noise-cancelling transistors 96P and 96N may be replaced with any desired types of noise-cancelling devices. As another example, noise-cancelling transistor 96P may be replaced with a PN junction diode coupled between output terminal 104P and circuit node 76 and/or noise-cancelling transistor 96N may be replaced with a PN junction diode coupled between output terminal 104N and circuit node 98.

Transistors 90P, 90N, 78P, 78N, 96P, 96N, and 102 may be implemented using any desired transistor technologies. Transistors 90P, 90N, 78P, 78N, 96P, 96N, and/or 102 may include, for example, n-channel transistors such as n-type metal-oxide-semiconductor (NMOS) devices, p-channel transistors such as p-type metal-oxide-semiconductor (PMOS) devices, complementary metal-oxide-semiconductor (CMOS) devices, etc. Transistors 90P, 90N, 78P, 78N, 96P, 96N, and 102 have respective source, drain, and gate terminals. The terms "source" and "drain" are sometimes used interchangeably when referring to current-conducting terminals of a metal-oxide-semiconductor transistor. The source and drain terminals are therefore sometimes referred to as "source-drain" terminals (e.g., a transistor has a gate terminal, a first source-drain terminal, and a second source-drain terminal).

During signal peak measurement (e.g., while processing operation 66 of FIG. 4), a portion of the radio-frequency signals on radio-frequency transmission line path 36 (FIG. 3) is received as input signal RFIN at input terminal 72. Input signal RFIN is a single-ended signal. Peak detector 54 may measure the peak voltage level of input signal RFIN and thus the radio-frequency signals on radio-frequency transmission line path 36. Peak detector 54 may output a DC voltage VOUT across output terminals 104P and 104N that is indicative of the measured peak voltage level of input signal RFIN. Voltage VOUT is sometimes also referred to herein as output signal VOUT.

The magnitude of output signal VOUT (e.g., the DC voltage across output terminals 104P and 104N) is given by the difference between voltage VOUTP on output terminal 104P and voltage VOUTN on output terminal 104N (e.g., $|VOUT|=|VOUTP-VOUTN|$). If input signal RFIN has a peak voltage level VIN, the magnitude of output signal VOUT is proportional to the square of the absolute value of the peak voltage VIN of input signal RFIN (e.g., $|VOUTP-VOUTN|\sim|VIN|^2$). Processing circuitry on device 10 may thereby identify the peak voltage VIN of the radio-frequency signals received over radio-frequency transmission line path 36 based on the magnitude of the output signal VOUT produced by peak detector 54 (e.g., after converting the magnitude of output signal VOUT into corresponding digital voltage level information VLI and accounting for the square law relation between the generated output signal VOUT and the magnitude VIN of input signal RFIN).

This relation between output signal VOUT and input signal RFIN is caused by the square law operation of transistors 78P and 78N. During peak measurement, input signal RFIN drives the gate terminal of transistor 78P (e.g., while the gate terminals of transistors 78P and 78N are biased by bias transistor 102). Corresponding current flows along signal line 80P through transistor 78P and along signal line 80N through transistor 78N, as shown by arrows 106. The current flowing through transistors 78P and 78N may be decomposed into a signal current $I_S$, associated with the signal-of-interest in input signal RFIN, and a noise current $I_N$ associated with noise in input signal RFIN. Transistors 78P and 78N apply a square law function to the voltage provided to output terminals 104P and 104N, producing voltage VOUTP on output terminal 104P and voltage VOUTN on output terminal 104N (e.g., outputting the output signal VOUT as a DC voltage across output terminals 104P and 104N). Transistors 90P and 90N perform single-ended-to-differential signal conversion on signal lines 80P and 80N, effectively converting from the single-ended signal domain of input signal RFIN to the differential signal domain of output signal VOUT.

Without noise-cancelling transistors 96P and 96N in peak detector 54, output signal VOUT can be dominated by noise when the signal-of-interest in input signal RFIN is at a relatively low signal level. Noise-cancelling transistors 96P and 96N may form current feedback loops for transistors 78P and 78N, respectively, that serve to remove this noise from output signal VOUT.

For example, as shown by current loop 84 of FIG. 5, when the gate terminal of transistor 78P is driven using input signal RFIN, the noise current $I_N$ flowing through the source-drain terminals of transistor 78P passes from the first source-drain terminal of transistor 78P, onto the first source-drain terminal of noise-cancelling transistor 96P, through noise-cancelling transistor 96P onto the second source-drain terminal of noise-cancelling transistor 96P, and from the second source-drain terminal of noise-cancelling transistor 96P onto circuit node 76 and the gate terminal of transistor 78P. Because noise-cancelling transistor 96P is diode-connected (e.g., because the same noise current $I_N$ is concurrently supplied to the gate terminal and the first source-drain terminal of noise-cancelling transistor 96P), current does not flow in the reverse direction through noise-cancelling transistor 96P and back onto the first source-drain terminal of transistor 78P. The noise current $I_N$ that is driven onto the gate terminal of transistor 78P by noise-cancelling transistor 96P is inverted relative to the noise current $I_N$ flowing between the source-drain terminals of transistor 78P (e.g., the noise current $I_N$ at the gate terminal of transistor 78P and the noise current $I_N$ flowing through the source-drain terminals of transistor 78P have opposite signs). This serves to substantially cancel out the noise current $I_N$ component of the voltage VOUTP produced at output terminal 104P by transistor 78P.

Similarly, as shown by current loop 86 of FIG. 5, the noise current $I_N$ flowing through the source-drain terminals of transistor 78N passes from the first source-drain terminal of transistor 78N, onto the first source-drain terminal of noise-cancelling transistor 96N, through noise-cancelling transistor 96N onto the second source-drain terminal of noise-cancelling transistor 96N, and from the second source-drain terminal of noise-cancelling transistor 96N onto circuit node 98 and the gate terminal of transistor 78N. Because noise-cancelling transistor 96N is diode-connected (e.g., because the same noise current $I_N$ is concurrently supplied to the gate terminal and the first source-drain terminal of noise-cancelling transistor 96N), current does not flow in the reverse direction through noise-cancelling transistor 96P and back onto the first source-drain terminal of transistor 78N. The noise current $I_N$ that is driven onto the gate terminal of transistor 78N by noise-cancelling transistor 96N is inverted relative to the noise current $I_N$ flowing between the source-drain terminals of transistor 78N (e.g., the noise current $I_N$ at the gate terminal of transistor 78N and the noise current $I_N$ flowing through the source-drain terminals of transistor 78N have opposite signs). This serves to substantially cancel out the noise current $I_N$ component of the voltage VOUTN produced at output terminal 104N by transistor 78N. In this way, noise-cancelling transistors 96P and 96N may cancel out noise (e.g., contributions from noise current $I_N$) from input signal RFIN while generating output signal VOUT, preventing the noise from dominating output signal VOUT and allowing peak detector 54 to generate highly accurate and noise-mitigated peak voltage level measurements of the radio-frequency signals on radio-frequency transmission line path 36.

Figure 6:
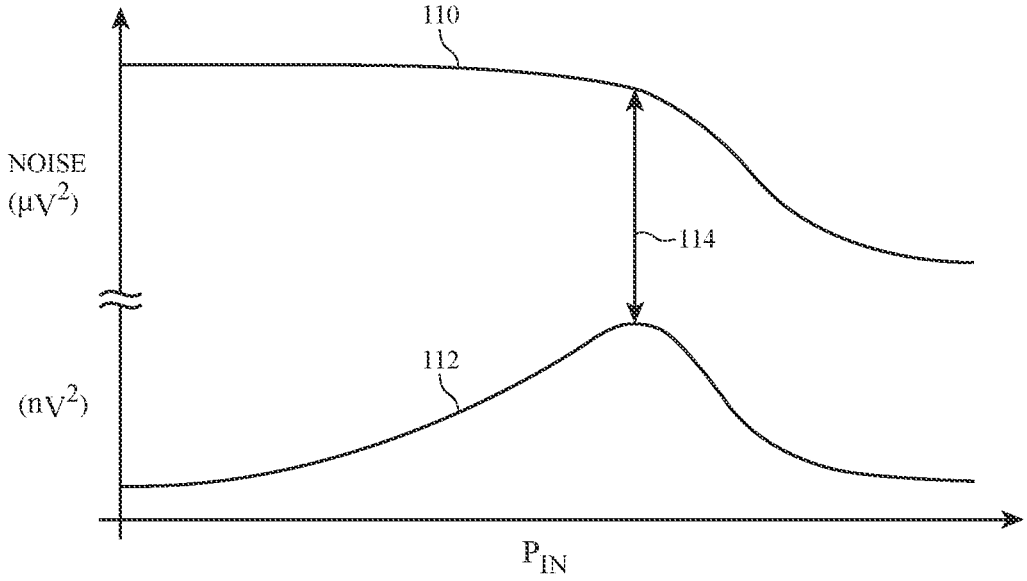
FIG. 6 is a plot of noise as a function of input power showing how an illustrative peak detector having noise-cancelling transistors may minimize noise in signal peak measurements in accordance with some embodiments.

FIG. 6 is a plot showing how noise-cancelling transistors 96P and 96N may serve to minimize noise in output signals VOUT. The vertical axis of FIG. 6 plots noise level (e.g., from nV$^2$ to uV$^2$). The horizontal axis of FIG. 6 plots the input power level $P_{IN}$ of input signal RFIN. Curve 110 plots the noise in output signal VOUT in implementations where noise-cancelling transistors 96P and 96N are omitted from peak detector 54. Curve 112 plots the noise in output signal VOUT when peak detector 54 includes noise-cancelling transistors 96P and 96N. As shown by curves 110 and 112, noise-cancelling transistors 96P and 96N may serve to reduce noise in output signal VOUT across all input power levels $P_{IN}$ of input signal RFIN, by at least margin 114 (e.g., 10-30 dB). The example of FIG. 6 is illustrative and, in practice, curves 110 and 112 may have other shapes.

As used herein, the term "concurrent" means at least partially overlapping in time. In other words, first and second events are referred to herein as being "concurrent" with each other if at least some of the first event occurs at the same time as at least some of the second event (e.g., if at least some of the first event occurs during, while, or when at least some of the second event occurs). First and second events can be concurrent if the first and second events are simultaneous (e.g., if the entire duration of the first event overlaps the entire duration of the second event in time) but can also be concurrent if the first and second events are non-simultaneous (e.g., if the first event starts before or after the start of the second event, if the first event ends before or after the end of the second event, or if the first and second events are partially non-overlapping in time). As used herein, the term "while" is synonymous with "concurrent." The term "when" also implies at least some concurrency (e.g., event A occurring "when" event B occurs means that at least some of event A is concurrent with at least some of event B).

The methods and operations described above in connection with FIGS. 1-6 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

Devices 10 may gather and/or use personally identifiable information. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The foregoing is illustrative and various modifications can be made to the described embodiments. The foregoing embodiments may be implemented individually or in any combination.

What is claimed is:

1. A voltage peak detector having an input terminal and a differential output, the voltage peak detector comprising:
    a first transistor having a first gate terminal communicatively coupled to the input terminal, having a first source-drain terminal coupled to a first output terminal of the differential output, and having a second source-drain terminal communicatively coupled to a ground;

a second transistor having a third source-drain terminal coupled to a power supply voltage and having a fourth source-drain terminal coupled to the first output terminal;

a diode-connected transistor having a fifth source-drain terminal coupled to the first output terminal and having a sixth source-drain terminal coupled to the first gate terminal, wherein the diode-connected transistor has a second gate terminal that is connected to the fifth source-drain terminal;

a third transistor having a second gate terminal coupled to a first circuit node, having a seventh source-drain terminal coupled to a second output terminal of the differential output, and having an eighth source-drain terminal communicatively coupled to the ground;

a fourth transistor having a ninth source-drain terminal coupled to the power supply voltage and having a tenth source-drain terminal coupled to the second output terminal, wherein the second transistor has a third gate terminal coupled to a second circuit node and the fourth transistor has a fourth gate terminal coupled to the second circuit node;

a first resistor coupled in series between the second circuit node and the first output terminal;

a second resistor coupled in series between the second circuit node and the second output terminal;

a fifth transistor having a fifth gate terminal, having an eleventh source-drain terminal coupled to the fifth gate terminal, and having a twelfth source-drain terminal, wherein the twelfth source-drain terminal is coupled to the ground;

a third resistor coupled in series between the eleventh source-drain terminal and the first gate terminal; and a fourth resistor coupled in series between the eleventh source-drain terminal and the first circuit node.

2. The voltage peak detector of claim 1, wherein the diode-connected transistor is configured to pass a noise current from the fifth source-drain terminal onto the first gate terminal.

3. The voltage peak detector of claim 2, wherein the first transistor is configured to pass the noise current between the first source-drain terminal and the second source-drain terminal, the noise current as passed by the diode-connected transistor onto the first gate terminal being an inversion of the noise current as passed between the first source-drain terminal and the second source-drain terminal.

4. The voltage peak detector of claim 1, further comprising:

an additional diode-connected transistor having a thirteenth source-drain terminal coupled to the second output terminal, having a fourteenth source-drain terminal coupled to the first circuit node, and having a sixth gate terminal connected to the thirteenth source-drain terminal.

5. The voltage peak detector of claim 1, further comprising:

an additional diode-connected transistor having an eleventh source-drain terminal coupled to the second output terminal and having a twelfth source-drain terminal coupled to the first circuit node.

6. The voltage peak detector of claim 1, wherein the first transistor and the third transistor are square law devices.

7. Wireless circuitry comprising:

a radio-frequency transmission line path configured to convey a radio-frequency signal;

an analog-to-digital converter (ADC);

a peak detector having an output communicatively coupled to the ADC, wherein the peak detector includes a differential pair of transistors coupled between a power supply voltage and the output, a first transistor having a first gate terminal configured to receive the radio-frequency signal from the radio-frequency transmission line path and having a first source-drain terminal coupled to the output, and a second transistor having a second source-drain terminal coupled to the output and the first source-drain terminal, having a second gate terminal coupled to the second source-drain terminal, and having a third source-drain terminal coupled to the first gate terminal;

a third transistor having a third gate terminal and having a fourth source-drain terminal, the fourth source-drain terminal being coupled to the output;

a fourth transistor having a fifth source-drain terminal coupled to the output and the fourth source-drain terminal, having a fourth gate terminal coupled to the fifth source-drain terminal, and having a sixth source-drain terminal coupled to the third gate terminal; and a fifth transistor having a seventh source-drain terminal communicatively coupled to the first gate terminal and the third gate terminal and having a fifth gate terminal coupled to the seventh source-drain terminal.

8. The wireless circuitry of claim 7, wherein the peak detector is configured to generate a DC voltage at the output based on the radio-frequency signal, the ADC being configured to generate a digital value based on the DC voltage.

9. The wireless circuitry of claim 8, wherein the radio-frequency signals are in a satellite navigation band and the wireless circuitry further comprises one or more processors configured to mitigate a jammer signal in response to the digital value exceeding a threshold value.

10. A voltage peak detector having an input terminal and a differential output, the voltage peak detector comprising:

a first transistor having a first gate terminal communicatively coupled to the input terminal, having a first source-drain terminal coupled to a first output terminal of the differential output, and having a second source-drain terminal communicatively coupled to a ground;

a second transistor having a third source-drain terminal coupled to a power supply voltage and having a fourth source-drain terminal coupled to the first output terminal;

a diode-connected transistor having a fifth source-drain terminal coupled to the first output terminal and having a sixth source-drain terminal coupled to the first gate terminal; and a third transistor, wherein the third transistor has a seventh source-drain terminal communicatively coupled to the first gate terminal and the sixth source-drain terminal; and a fourth transistor having a second gate terminal, an eighth source-drain terminal coupled to a second output terminal of the differential output, and a ninth source-drain terminal communicatively coupled to the ground, wherein the seventh source-drain terminal is communicatively coupled to the second gate terminal.

11. The voltage peak detector of claim 10, wherein the third transistor has a tenth source-drain terminal coupled to the ground.

12. The voltage peak detector of claim 10, wherein the third transistor has a third gate terminal coupled to the seventh source-drain terminal.

* * * * *